US011252842B2

(12) United States Patent
Jeong et al.

(10) Patent No.: US 11,252,842 B2
(45) Date of Patent: Feb. 15, 2022

(54) COMPOSITE PIN FIN HEAT SINK WITH IMPROVED HEAT DISSIPATION PERFORMANCE

(71) Applicant: Pusan National University Industry-University Cooperation Foundation, Busan (KR)

(72) Inventors: Ji Hwan Jeong, Seoul (KR); Danish Ansari, Busan (KR)

(73) Assignee: Pusan National University Industry-University Cooperation Foundation, Busan (KR)

( * ) Notice: Subject to any disclaimer, the term of this patent is extended or adjusted under 35 U.S.C. 154(b) by 0 days.

(21) Appl. No.: 17/069,014

(22) Filed: Oct. 13, 2020

(65) Prior Publication Data

US 2022/0007542 A1 Jan. 6, 2022

(30) Foreign Application Priority Data

Jul. 1, 2020 (KR) .................. 10-2020-0080910

(51) Int. Cl.
*H05K 7/20* (2006.01)
*H01L 23/367* (2006.01)
(Continued)

(52) U.S. Cl.
CPC ..... *H05K 7/20518* (2013.01); *H01L 23/3677* (2013.01); *H01L 23/3736* (2013.01); *H01L 23/473* (2013.01); *H05K 7/20254* (2013.01)

(58) Field of Classification Search
CPC ............. H01L 23/3677; H01L 23/3736; H01L 23/373; H01L 23/467; H01L 23/473; F28F 21/00–089
See application file for complete search history.

(56) References Cited

U.S. PATENT DOCUMENTS

| | | | | |
|---|---|---|---|---|
| 6,554,060 B2* | 4/2003 | Noda | ........................ | F28F 3/02 165/185 |
| 6,698,500 B2* | 3/2004 | Noda | ........................ | F28F 3/02 165/80.3 |
| 2009/0145581 A1* | 6/2009 | Hoffman | ............... | H01L 23/473 165/80.3 |

FOREIGN PATENT DOCUMENTS

| | | | |
|---|---|---|---|
| JP | 2011187523 A | * | 9/2011 |
| KR | 2002-0069806 A | | 9/2002 |
| KR | 10-2020-0019410 A | | 2/2020 |

OTHER PUBLICATIONS

Ansari, Danish, et al., "Hotspot thermal management using a microchannel-pinfin hybrid heat sink," *International Journal of Thermal Sciences*, vol. 134, Dec. 2018, pp. 27-39 (received in revised form Jun. 24, 2018; accepted Jul. 30, 2018; available online Aug. 6, 2018).

(Continued)

*Primary Examiner* — Zachary Pape
(74) *Attorney, Agent, or Firm* — NSIP Law

(57) ABSTRACT

A composite pin fin heat sink configured to dissipate heat generated by a heating element including a background region and a hot spot region having a higher temperature than the background region while the heating element is generating heat, the heat sink including a base plate having a first surface and a second surface, the first surface being configured to contact the heating element; and an array of pin fins protruding from the second surface and arranged at regular intervals. The base plate and the array of pin fins are divided into a first heat sink region corresponding to the hot spot region of the heating element, and a second heat sink region corresponding to the background region of the heating element. The first heat sink region is made of a material having a higher thermal conductivity than a material of which the second heat sink region is made.

8 Claims, 15 Drawing Sheets

(51) Int. Cl.
*H01L 23/473* (2006.01)
*H01L 23/373* (2006.01)

(56) References Cited

OTHER PUBLICATIONS

Ansari, Danish, et al., "A novel composite pinfin heat sink for hotspot mitigation," *International Journal of Heat and Mass Transfer*, vol. 156, Aug. 2020, Article 119843, pp. 1-12 (revised Apr. 18, 2020; accepted Apr. 19, 2020).

* cited by examiner (c)

(d)

(e)

COMPOSITE PIN FIN HEAT SINK WITH IMPROVED HEAT DISSIPATION PERFORMANCE

CROSS REFERENCE TO RELATED APPLICATIONS

This application claims the benefit under 35 USC 119(a) of Korean Patent Application No. 10-2020-0080910 filed on Jul. 1, 2020, the entire disclosure of which is incorporated herein by reference for all purposes.

BACKGROUND

1. Field

This application relates to a composite pin fin heat sink with improved heat dissipation performance.

2. Description of Related Art

A central processing unit (CPU) including 2300 transistors was first developed by Intel Corporation in 1971. Since then, CPU technology has developed to the point that a recent high-performance CPU includes up to 5.4 billion transistors.

Such a considerable increase in the number of transistors included in a CPU brings a dramatic improvement in a performance of the CPU as a positive aspect, but also a considerable increase in heat generation in the CPU as a negative aspect. The increased heat generation can cause significant damage to the CPU, resulting in failure and breakdown of the CPU.

Generally, in a CPU, a temperature gradient occurs between a hot spot region of the CPU (referred to as a "core") where calculations and logical operations are performed, and a remaining region of the CPU (referred to as a "background region"). This temperature gradient aggravates heat-related problems, thereby promoting the failure or breakdown of the CPU.

For this reason, existing CPUs are equipped with a heat-dissipating means. A typical example of the heat-dissipating means is a cooler composed of a cooling fan and a heat sink. The heat sink is made of a material having a high thermal conductivity and functions to absorb the heat of a CPU and radiate it to the air.

Conventional heat sinks can address the heat-related problems of a CPU to some extent. However, since the conventional heat sinks are designed on the assumption that a thermal design power (TDP) of the CPU is uniformly distributed throughout the entire region of the CPU, the conventional heat sinks uniformly cool the entire region of the CPU. Therefore, with the conventional heat sinks, the problem of the temperature gradient cannot be solved. Accordingly, there has been a need for a heat sink capable of effectively dissipating the heat of a heating element (for example, a CPU) having a temperature gradient and reducing the temperature gradient of the heating element.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a composite pin fin heat sink is configured to dissipate heat generated by a heating element, the heating element including a background region and a hot spot region having a higher temperature than the background region while the heating element is generating heat, the heat sink including a base plate including a first surface and a second surface, the first surface of the base plate being configured to contact the heating element; and an array of pin fins protruding from the second surface of the base plate and arranged at regular intervals on the second surface of the base plate, wherein the base plate and the array of pin fins are divided into a first heat sink region corresponding to the hot spot region of the heating element, and a second heat sink region corresponding to the background region of the heating element, and the first heat sink region is made of a material having a higher thermal conductivity than a material of which the second heat sink region is made.

The first heat sink region may be made of a material having a thermal conductivity that is 30% to 80% higher than the material of which the second heat sink region is made.

The first heat sink region may be made of copper, and the second heat sink region may be made of aluminum.

Under conditions in which a heat flux of 200 kW/m² generated by the background region of the heating element and a heat flux of 600 kW/m² generated by the hot spot region of the heating element are dissipated by water having a Reynolds number of 108 to 865 supplied to the heat sink as a coolant, a thermal resistance $R_{th,tot}$ of the heat sink calculated according to the following equation may have a value of 0.042 K/W to 0.085 K/W:

$$R_{th,tot} = \frac{T_{max,base} - T_{f,in}}{Q_{tot}}$$

$T_{max,base}$ is a maximum temperature of the first surface of the base plate while the heating element is generating heat, $T_{f,in}$ is an initial temperature of the coolant supplied to the heat sink, and $Q_{tot}$ is a total amount of heat transferred from the heating element to the heat sink.

Under conditions that a heat flux of 200 kW/m² generated by the background region of the heating element and a heat flux of 600 kW/m² generated by the hot spot region of the heating element are dissipated by water having a Reynolds number of 108 to 865 supplied to the heat sink as a coolant, a mean absolute temperature deviation $\delta_{T,base}$ of the first surface of the base plate calculated according to the following equation may have a value of 6.7 K to 14.0 K:

$$\delta_{T,base} = \frac{|T_{max,base} - T_{avg,base}| + |T_{min,base} - T_{avg,base}|}{2}$$

$T_{max,base}$ and $T_{min,base}$ are a maximum temperature and a minimum temperature, respectively, of the first surface of the base plate while the heating element is generating heat, and $T_{avg,base}$ is an average temperature of the first surface of the base plate while the heating element is generating heat.

Under conditions that a heat flux of 200 kW/m² generated by the background region of the heating element and a heat flux of 600 kW/m² to 1600 kW/m² generated by the hot spot region of the heating element are dissipated by water having a Reynolds number of 865 supplied to the heat sink as a coolant, a thermal resistance $R_{th,tot}$ of the heat sink calculated according to the following equation may have a value of 0.042 K/W to 0.085 K/W:

$$R_{th,tot} = \frac{T_{max,base} - T_{f,in}}{Q_{tot}}$$

$T_{max,base}$ is a maximum temperature of the first surface of the base plate while the heating element is generating heat, is a temperature of the coolant supplied to the heat sink, and $Q_{tot}$ is a total amount of heat transferred from the heating element to the heat sink.

Under conditions that a heat flux of 200 kW/m² and a heat flux of 600 kW/m² to 1600 kW/m² generated by the hot spot region of the heating element are dissipated by water having a Reynolds number of 865 supplied to the heat sink as a coolant, a mean absolute temperature deviation $\delta_{T,base}$ of the first surface of the base plate calculated according to the following equation may have a value of 6.7 K to 21.8 K:

$$\delta_{T,base} = \frac{|T_{max,base} - T_{avg,base}| + |T_{min,base} - T_{avg,base}|}{2}$$

$T_{max,base}$ and $T_{min,base}$ are a maximum temperature and a minimum temperature, respectively, of the first surface of the base plate while the heating element is generating heat, and $T_{avg,base}$ is an average temperature of the first surface of the base plate while the heating element is generating heat.

Each of the pin fins may have a cylindrical shape having an aspect ratio of 5.5 to 7, where the aspect ratio is a ratio of a height of each of the pin fins to a diameter of each of the pin fins, and a ratio of the diameter of each of the pin fins to a distance between each of the pin fins may be 0.45 to 0.55.

A ratio of a height of each of the pin fins to a thickness of the base plate may be 3.5 to 4.5.

In another general aspect, a composite pin fin heat sink is configured to dissipate heat generated by a heating element, the heat generated by the heating element having a non-uniform heat distribution on a surface of the heating element, the composite pin fin heat sink including a base plate including a first surface and a second surface, the first surface of the base plate being configured to contact the surface of the heating element; and an array of pin fins protruding from the second surface of the base plate, wherein a composition of the heat sink depends on the non-uniform heat distribution of the heat generated by the heating element.

The surface of the heating element may include a first region generating a first heat flux, and a second region generating a second heat flux less than the first heat flux, and the heat sink may include a first heat sink region corresponding to the first region of the heating element and made of a first material, and a second heat sink region corresponding to the second region of the heating element and made of a second material different from the first material.

A thermal conductivity of the first material may be higher than a thermal conductivity of the second material.

A thermal conductivity of the first material may be 30% to 80% higher than a thermal conductivity of the second material.

The first material may be any one or any combination of any two or more of gold, silver, and copper, and the second material may be aluminum.

The pin fins may be arranged at regular intervals on the second surface of the base plate, and may define straight channels configured to receive a coolant.

Each of the pin fins may have a cylindrical shape having an aspect ratio of 5.5 to 7, where the aspect ratio is a ratio of a height of each of the pin fins to a diameter of each of the pin fins.

Each of the pin fins may have a cylindrical shape having an aspect ratio of 5.8 to 7, where the aspect ratio is a ratio of a height of each of the pin fins to a diameter of each of the pin fins.

Each of the pin fins may have a cylindrical shape, and a ratio of a diameter of each of the pin fins to a distance between each of the pin fins may be 0.45 to 0.55.

A ratio of a height of each of the pin fins to a thickness of the base plate may be 3.5 to 4.5.

In another general aspect, a composite pin fin heat sink is configured to dissipate heat generated by a heating element, the heat generated by the heating element having a non-uniform heat distribution on a surface of the heating element, the composite pin fin heat sink including a base plate including a first surface and a second surface, the first surface of the base plate being configured to contact the surface of the heating element; and an array of pin fins protruding from the second surface of the base plate, wherein a thermal conductivity of the heat sink depends on the non-uniform heat distribution of the heat generated by the heating element.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
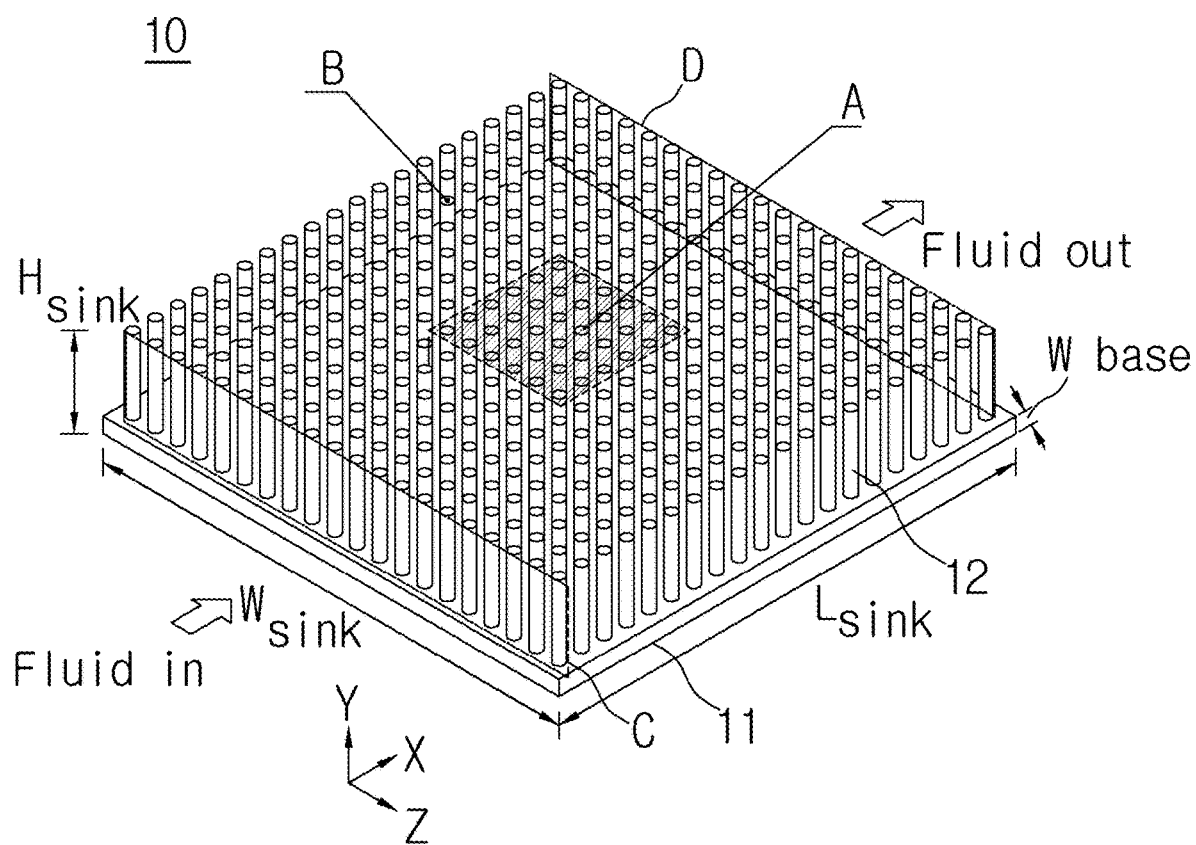
FIG. 1 is a perspective view of an example of a composite pin fin heat sink with an improved heat dissipation performance.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of functions and constructions that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Use herein of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various elements, these elements are not to be limited by these terms. Rather, these terms are only used to distinguish one element from another element. Thus, a first element referred to in examples described herein may also be referred to as a second element without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated by 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not exclude the presence or addition of one or more other features, numbers, operations, members, elements, and/or combinations thereof.

The features of the examples described herein may be combined in various ways as will be apparent after an understanding of the disclosure of this application. Furthermore, although the examples described herein have a variety of configurations, other configurations are possible as will be apparent after an understanding of the disclosure of this application.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

According to an example of this application, a composite pin fin heat sink with an improved heat dissipation performance is a device for dissipating the heat of a heating element including a background region and a hot spot region having a higher temperature than the background region. The heating element may be a central processing unit (CPU). However, the heating element is not limited to a CPU.

The hot spot region of the heating element is a region of the heating element (for example, a core of a CPU) generating a higher heat flux than a remaining region of the heating element, and the background region of the heating element is the remaining region of the heating element.

In a CPU, the hot spot region corresponds to the core of the CPU, and the background region corresponds to the remaining region of the CPU other than the core, and the heat flux generated by the hot spot region may be up to 8 times higher than the heat flux generated by the background region. This difference in the heat fluxes produces a temperature gradient in the heating element.

It is important not only to cool the CPU down below a specific temperature, but also to make the temperature of the CPU as uniform as possible throughout the entire region of the CPU.

The inventors of this application have made the invention described in this application through persistent research and numerous experiments on technology for reducing a temperature gradient of a heating element such as a CPU as well as for dissipating heat generated by the heating element.

Figure 2:
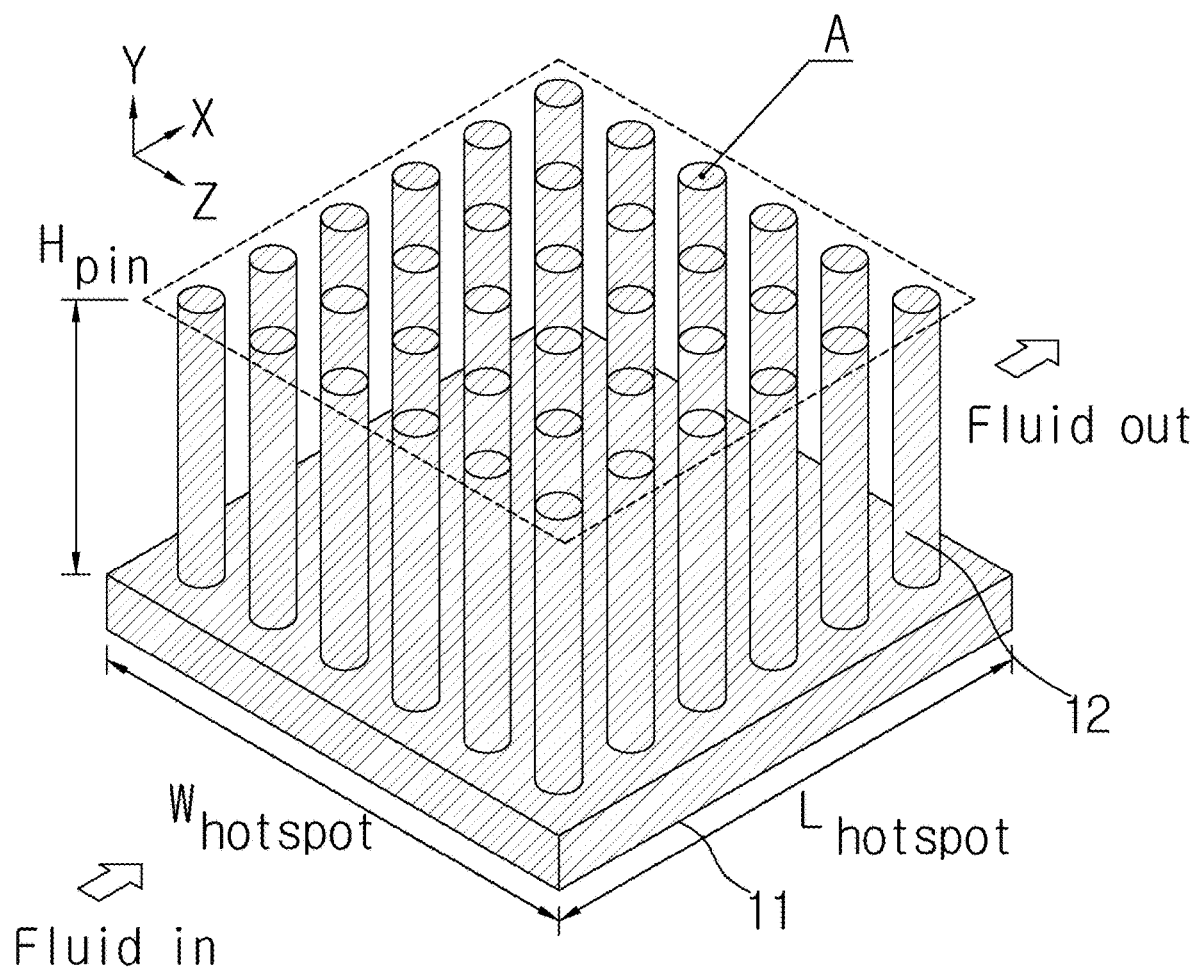
FIG. 2 is a perspective view of a first heat sink region of a base plate and pin fins in the composite pin fin heat sink of FIG. 1.
Figure 3:
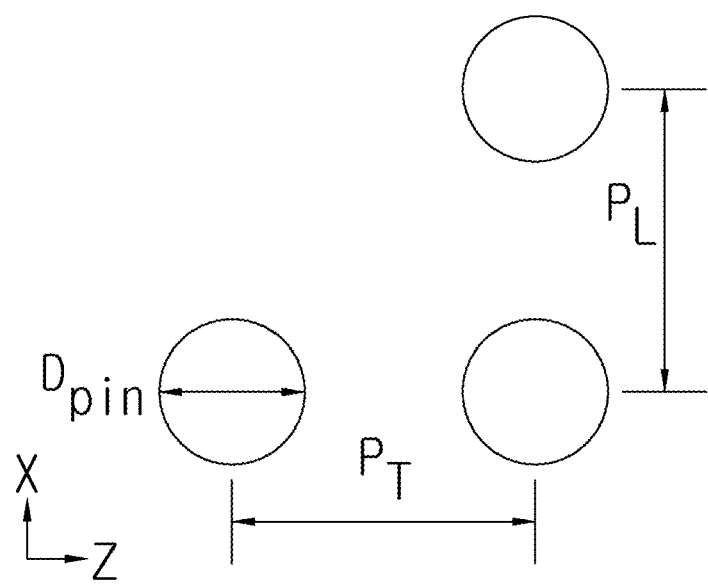
FIG. 3 is a horizontal cross-sectional view illustrating several pin fins of the composite pin fin heat sink of FIG. 1.

FIG. 1 is a perspective view of an example of a composite pin fin heat sink with an improved heat dissipation performance. FIG. 2 is a perspective view of a first heat sink region of a base plate and pin fins in the composite pin fin heat sink of FIG. 1. FIG. 3 is a horizontal cross-sectional view illustrating several pin fins of the composite pin fin heat sink of FIG. 1.

Referring to FIG. 1, a composite pin fin heat sink 10 includes a base plate 11 and an array of pin fins 12.

The base plate 11 is a plate having a predetermined thickness, and a first surface of the base plate 11 is in contact with the heating element, thereby receiving the heat generated by the heating element.

In order to effectively dissipate the heat received from the heating element, the array of pin fins 12 is formed to perpendicularly protrude from a second surface of the base plate 11 on which the pin fins 12 are arranged at regular intervals. The pin fins 12 are elements to effectively receive the heat from the base plate 11 and transfer this heat to a coolant.

A coolant such as air or water flows through channels defined between each of the pin fins 12. The composite pin fin heat sink 10 can dissipate the heat of the heating element on the basis of heat exchange between the pin fins 12 and the coolant flowing through the channels defined between each of the pin fins 12.

In the example in FIG. 1, each of the pin fins 12 has a cylindrical shape to maximize a surface area that is in contact with the coolant, thereby maximizing the heat dissipation efficiency. However, this is just an example, and each of the pin fins 12 may have another shape, such as a polygonal prism shape. That is, the pin fins 12 are not limited to any particular shape.

To increase the surface area of the heat sink 10 that is in contact with the coolant, an aspect ratio (a ratio of a height of a pin fin 12 to a diameter of the pin fin 12) of each of the pin fins 12 is preferably in a range of 5.5 to 7, and more preferably in a range of 5.8 to 7.

When the aspect ratio of the pin fins 12 is less than 5.5, the surface area of the heat sink 10 that is in contact with the coolant is too small. This causes a deterioration in the heat dissipation efficiency of the heat sink 10. Conversely, when the aspect ratio exceeds 7, the height of the pin fins 12 is too large, and many problems may occur when the heat sink 10 is mounted on a target structure, and the mechanical strength of the pin fins 12 is weak.

For an efficient heat dissipation of the heating element, it is preferable that a ratio of the diameter of each of the pin fins 12 to a distance between two pin fins 12 adjacent to each other is in a range of 0.45 to 0.55.

Herein, the distance between one pin fin 12 and a neighboring pin fin 12 is defined as a center-to-center distance between the pin fins 12.

When the ratio of the diameter of each pin fin 12 to the distance between two pin fins 12 adjacent to each other is less than 0.45 because the distance between the pin fins 12 is too large, the number of the pin fins 12 provided on the base plate 11 is too small to obtain a high heat dissipation efficiency.

When the ratio of the diameter of the pin fins 12 to the distance between the pin fins 12 is less than 0.45 because the diameter of the pin fins 12 is too small, the mechanical strength of the pin fins 12 is insufficient.

When the ratio of the diameter of the pin fins 12 to the distance between the pin fins 12 exceeds 0.55 because the distance between the pin fins 12 is too small, the coolant has difficulty in flowing through the channels defined between the pin fins 12.

When the ratio of the diameter of the pin fins 12 to the distance between the pin fins 12 adjacent to each other exceeds 0.55 because the diameter of the pin fins 12 is too large, the number of the pin fins 12 provided on the base plate 11 is too small, resulting in a decrease in the total area of the pin fins 12. In this case, it is difficult to obtain a sufficient heat dissipation efficiency.

A ratio of the height of the pin fins 12 to a thickness of the base plate 11 is preferably in a range of 3.5 to 4.5.

When the ratio of the height of the pin fins 12 to the thickness of the base plate 11 is less than 3.5, the surface area of the pin fins 12 in contact with the coolant is small. Therefore, the heat dissipation efficiency of the composite pin fin heat sink 10 is insufficient. On the contrary, when the ratio is greater than 4.5, the base plate 11 is too thin to have a sufficient strength to stably support the pin fins 12.

When the composite pin fin heat sink 10 is mounted on a heating element having a hot spot region and a background region, the base plate 11 and the array of pin fins 12 may be imaginarily divided into a first heat sink region A including a portion of the base plate 11 and a portion of the pin fins 12, and a second heat sink region B including a remaining portion of the base plate 11 and a remaining portion of the pin fins 12. The first heat sink region A is positioned above the hot spot region of the heating element, and the second heat sink region B is positioned above the background region of the heating element. The portions of the base plate 11 and the pin fins 12 in the first heat sink region A are made of a material having a higher thermal conductivity than a material of which the portions of the base plate 11 and the pin fins 12 in the second heat sink region B are made.

When the first heat sink region A is made of a material having a higher thermal conductivity than the material of which the second heat sink region B is made, the heat dissipation efficiency in the hot spot region of the heating element is higher than the heat dissipation efficiency in the background region of the heating element, and therefore the hot spot region can be more cooled than the background region. Therefore, a temperature difference between the hot spot region and the background region decreases. That is, a temperature gradient of the heating element can be effectively reduced.

Preferably, the first heat sink region A may be made of a material having a thermal conductivity that is 30% to 80% higher than a thermal conductivity of the material of which the second heat sink region B is made. For example, the second heat sink region B may be made of aluminum, and the first heat sink region A may be made of any one or any combination of any two or more of gold, silver, and copper, all of which have a higher thermal conductivity than aluminum.

When the thermal conductivity of the material of the first heat sink region A is 30% to 80% higher than the thermal conductivity of the material of the second heat sink region B, in the case where the composite pin fin heat sink 10 is applied to a CPU having a temperature gradient when operating, the temperature gradient can be effectively reduced.

More preferably, the first heat sink region A is made of copper and the second heat sink region B is made of aluminum, which has a lower thermal conductivity than copper.

Since the pin fins 12 having the same shape are regularly arranged, the coolant can flow through the channels defined between the pin fins 12 at a uniform velocity throughout the composite pin fin heat sink 10, thereby uniformly cooling the heating element. Therefore, it is possible to effectively reduce the temperature gradient of the heating element without a variation in cooling efficiency, which is usually attributable to the geometric shape of the composite pin fin heat sink 10.

Preparation of Heating Element

A single-core central processing unit (CPU) composed of a background region and a hot spot region generating a higher heat flux than a heat flux generated by the background region was prepared as a heating element. The CPU had a square shape that was 50 mm long and wide, and the hot spot region was positioned at the center of the CPU and had a square shape that was 15 mm long and wide.

Production of Composite Pin Fin Heat Sink

Production of Example According to Application

A composite pin fin heat sink 10 including a base plate 11 and an array of pin fins 12 was prepared. A first surface of the base plate 11 was placed in contact with the heating element prepared in the heating element preparation operation. A second surface of the base plate 11 was provided with the array of pin fins 12 arranged at regular intervals.

The prepared base plate had a square shape that was 50 mm long and wide so as to correspond to the prepared heating element. The composite pin fin heat sink 10 included a first heat sink region A corresponding to the hot spot region of the heating element and a second heat sink region B corresponding to the background region of the heating element. The first heat sink region A of the heat sink 10 was made of copper and the second heat sink region B of the heat sink 10 was made of aluminum.

The dimensions of the produced composite pin fin heat sink 10 are shown in Table 1 below.

TABLE 1

Composite Pin Fin Heat Sink (mm)

| Whole Region | | | | Hot Spot Region | | Pin Fin Region | | | |
| --- | --- | --- | --- | --- | --- | --- | --- | --- | --- |
| $L_{sink}$ | $W_{sink}$ | $H_{sink}$ | $W_{base}$ | $L_{hotspot}$ | $W_{hotspot}$ | $H_{pin}$ | $D_{pin}$ | $P_L$ | $P_T$ |
| 50 | 50 | 10 | 2 | 15 | 15 | 8 | 1.25 | 2.5 | 2.5 |

Referring to Table 1 and FIGS. 1 to 3, is the length of the composite pin fin heat sink 10, $W_{sink}$ is the width of the composite pin fin heat sink 10, $H_{sink}$ is the height of the composite pin fin heat sink 10, and $W_{base}$ is the thickness of the base plate 11. In addition, $L_{hotspot}$ and $W_{hotspot}$ are the length and the width, respectively, of the first heat sink region A corresponding to the hot spot region of the heating element.

X, Y, and Z of the coordinate system shown in FIGS. 1 to 3 denote an X axis, a Y axis, and a Z axis, respectively.

$H_{pin}$ and $D_{pin}$ are the height and the diameter, respectively, of one of the pin fins 12, and $P_L$ and $P_T$ are distances between the neighboring pin fins 12. More particularly, referring to FIG. 3, $P_L$ is the center-to-center distance between the pin fins 12 in the X-axis direction, and $P_T$ is the center-to-center distance between the pin fins 12 in the Z-axis direction.

Production of Comparative Example

A non-composite pin fin heat sink of a comparative example was prepared in the same manner as in the example according to the application described above (hereinafter referred to as the application example), but in the comparative example, both the first heat sink region A and the second heat sink region B were made of aluminum.

Test Example

In a test example, computational analysis (CA) using commercial computational fluid dynamics (CFD) software was performed to compare the heat dissipation performances of the composite pin fin heat sink 10 of the application example and the non-composite pin fin heat sink of the comparative example.

In the past, tests for analysis of heat dissipation performance of heat sinks were performed using heat sinks that were actually manufactured. However, in recent years, such tests have been performed based on an imaginary 3D-modeling structure having the same shape as an actual structure. When applying the same external boundary conditions as those of the actual structure to the 3D-modeling structure, the results of the tests conducted on the 3D-modeling structure were substantially the same as the results of the tests conducted on the actual structure.

In addition, since computational analysis is advantageous in that it is easy to change model shapes and analysis conditions, complicated structures that are difficult to test as actual structures can be easily tested using computational analysis. For this reason, computational analysis has become indispensable for developing products.

In the tests, a first surface of the base plate 11 of each of the composite pin fin heat sink 10 of the application example and the non-composite pin fin heat sink of the comparative example were disposed in contact with the prepared heating element. Specifically, a first heat sink region A and a second heat sink region B of each of the composite pin fin heat sink 10 and the non-composite pin fin heat sink were positioned to correspond to the hot spot region and the background region, respectively, of the heating element.

In performing the computational analysis on the composite pin fin heat sink 10 of the application example and the non-composite pin fin heat sink of the comparative example, the entire area of each heat sink 10 was tested. In addition, ANSYS CFX 18.2, which is a commercial computer fluid dynamics (CFD) software package, was used to calculate a Reynolds-averaged Navier-Stokes equation.

Test Example 1

Test Method

Test Example 1 was a test for comparing the heat dissipation performances of the heat sink of the application example and the heat sink of the comparative example by observing the cooling behavior of the heating element when a coolant flows through the channels between the pin fins 12.

In this test example, to observe a change in the cooling behavior with a change in a Reynolds number of the coolant, the heat fluxes generated by the hot spot region and the background region were fixed to 600 kW/m² and 200 kW/m², respectively, and the Reynolds number of the coolant was changed in the order of 108, 216, 324, 432, 541, 649, 757, and 865 during the test.

The initial temperatures of the heat sinks and the coolant were set to 300 K. In addition, the flow of the coolant was assumed to be a steady-state flow in a laminar flow regime, and the effects of gravity on the coolant and heat transfer to the atmosphere through thermal radiation were neglected. The coolant was water and was assumed to be incompressible.

To compare the heat dissipation performances of the heat sink of the application example and the heat sink of the comparative example on the basis of the obtained data, a thermal resistance $R_{th,tot}$ of each heat sink, a mean absolute temperature deviation (MATD) $\delta_{T,base}$ of the base plate of each heat sink, and a coolant pumping power $P_{tot}$ of each heat sink were calculated for each Reynolds number according to Equations 1 to 4 below.

The thermal resistance $R_{th,tot}$ was calculated according to Equation 1 below.

$$R_{th,tot} = \frac{T_{max,base} - T_{f,in}}{Q_{tot}} \quad (1)$$

In Equation 1, $T_{max,base}$ is a maximum temperature of the first surface of the base plate 11 while the heating element is generating heat, $T_{f,in}$ is an initial temperature of the coolant supplied to the heat sink, and $Q_{tot}$ is a total amount of heat transferred from the heating element to the heat sink.

$Q_{tot}$ in Equation 1 was calculated according to Equation 2 below.

$$Q_{tot} = q_{hs}A_{hs} + q_{bg}A_{bg} \quad (2)$$

In Equation 2, $q_{hs}$ and $q_{bg}$ are heat fluxes generated by the hot spot region and background region of the heating element, respectively, and $A_{hs}$ and $A_{bg}$ are areas of the first heat sink region A and the second heat sink region B corresponding to the hot spot region and the background region of the heating element, respectively.

The mean absolute temperature deviation (MATD) $\delta_{T,base}$ was calculated according to Equation 3 below.

$$\delta_{T,base} = \frac{|T_{max,base} - T_{avg,base}| + |T_{min,base} - T_{avg,base}|}{2} \quad (3)$$

In Equation 3, $T_{max,base}$ and $T_{min,base}$ are a maximum temperature and a minimum temperature, respectively, of the first surface of the base plate 11, which was in direct contact with the heating element, and $T_{avg,base}$ is an average temperature of the first surface of the base plate 11.

The pumping power $P_{tot}$ was calculated according to Equation 4 below.

$$P_{tot} = u_{avg} A_{inlet} \Delta p_{tot} \quad (4)$$

In Equation 4, $u_{avg}$ is an average velocity of the coolant at an inlet C of the heat sink, $A_{inlet}$ is a cross-sectional area of the inlet C of the heat sink, and $\Delta p_{tot}$ is a total pressure loss that occurs as the coolant flows from the inlet C of the heat sink to an outlet D of the heat sink.

Test Result

Figure 4A:
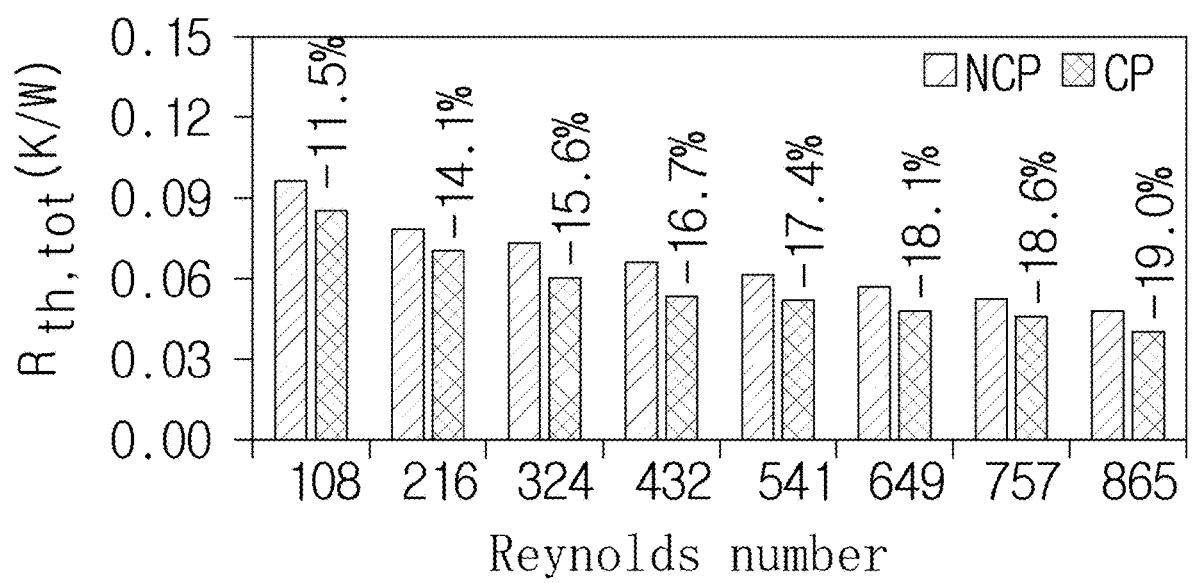
FIGS. 4A to 4C are graphs showing heat dissipation characteristics of a composite pin fin heat sink (CP) of an example according to this application and a non-composite pin fin heat sink (NCP) of a comparative example according to changes in a Reynolds number of a coolant.
Figure 4B:
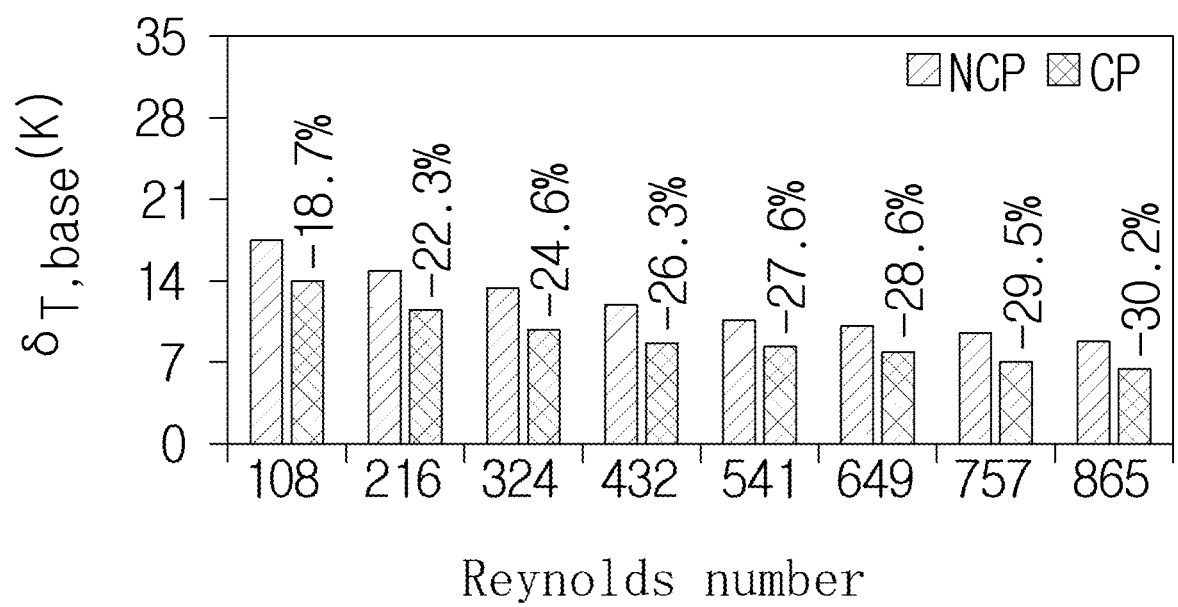
Figure 4C:
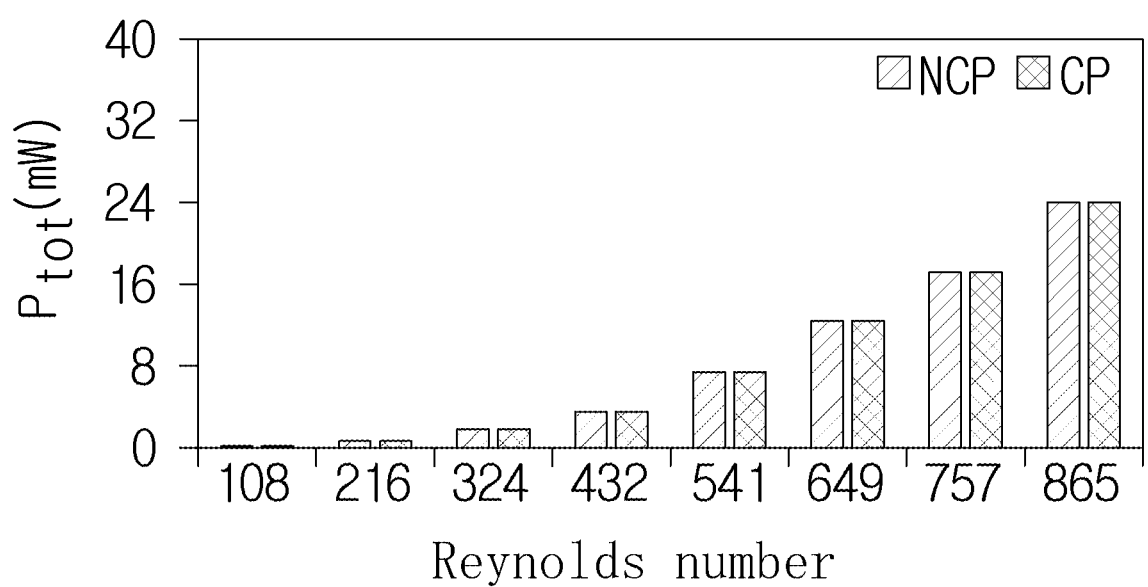

FIGS. 4A to 4C and Table 2 below show the thermal resistance $R_{th,tot}$, the MATD $\delta_{T,base}$, and the coolant pumping power $P_{tot}$ of the heat sink of the application example (denoted by CP) and the heat sink of the comparative example (denoted by NCP) that vary according to the changes in the Reynolds number of the coolant. The percentage values above the bars for CP in FIGS. 4A and 4B represent how much the numerical value of the CP is reduced compared to the numerical value of the NCP. In addition, the X axis in the graphs represents the Reynolds number of the coolant.

example is higher than the thermal performance of the heat sink of the comparative example at all of the Reynolds numbers. In other words, this means that the heat dissipation performance of the heat sink of the application example is better than the heat dissipation performance of the heat sink of the comparative example.

In addition, referring to Table 2 and FIG. 4B, when the Reynolds number was varied in the order of 108, 216, 324, 432, 541, 649, 757 and 865, respectively, the MATD $\delta_{T,base}$ of the CP was reduced by 18.7%, 22.3%, 24.6%, 26.3%, 27.6%, 28.6%, 29.5%, and 30.2%, respectively, compared to the MATD $\delta_{T,base}$ of the NCP. This means that the heat sink of the application example more uniformly cools the heating element than the heat sink of the comparative example at all of the Reynolds numbers, and also means that the temperature gradient of the heating element is reduced when the heat sink of the application example is used.

Referring to FIG. 4C, there is no difference in the coolant pumping power $P_{tot}$ required to pump the coolant between the heat sink of the application example and the heat sink of the comparative example. This means that the heat sink of the application example and the heat sink of the comparative example are geometrically identical to each other.

Test Example 2

Test Method

In Test Example 2, in order to compare the heat dissipation performances of the heat sink of the application example and the heat sink of the comparative example, the Reynolds number of the coolant was fixed to 865, the heat flux generated by the background region of the heating element was fixed to 200 kW/m², and the heat flux generated by the hot spot region was varied in the order of 600 kW/m², 800 kW/m², 1000 kW/m², 1200 kW/m², 1400 kW/m², and 1600 kW/m². Other conditions were the same as in Test Example 1.

TABLE 2

| | | Reynolds Number of Coolant | | | | | | | |
|---|---|---|---|---|---|---|---|---|---|
| | | 108 | 216 | 324 | 432 | 541 | 649 | 757 | 865 |
| Thermal Resistance ($R_{th,tot}$, K/W) | Comparative Example (NCP) | 0.096 | 0.078 | 0.070 | 0.064 | 0.059 | 0.056 | 0.054 | 0.052 |
| | Application Example (CP) | 0.085 | 0.067 | 0.059 | 0.053 | 0.049 | 0.046 | 0.044 | 0.042 |
| MATD ($\delta_{T,base}$, K) | Comparative Example (NCP) | 17.3 | 14.5 | 12.9 | 11.8 | 11.1 | 10.5 | 10.0 | 9.6 |
| | Application Example (CP) | 14.0 | 11.2 | 9.8 | 8.7 | 8.0 | 7.5 | 7.1 | 6.7 |
| Pumping Power ($P_{tot}$, mW) | Comparative Example (NCP) | 0.12 | 0.65 | 1.78 | 3.72 | 6.66 | 10.80 | 16.41 | 23.65 |
| | Application Example (CP) | 0.12 | 0.65 | 1.78 | 3.72 | 6.66 | 10.80 | 16.41 | 23.65 |

Referring to Table 2 and FIG. 4A, when the Reynolds number was varied in the order of 108, 216, 324, 432, 541, 649, 757 and 865, respectively, the thermal resistance $R_{th,tot}$ of the CP was reduced by 11.5%, 14.1%, 15.6%, 16.7%, 17.4%, 18.1%, 18.6%, and 19.0%, respectively, compared to the thermal resistance $R_{th,tot}$ of the NCP. This means that the thermal performance of the heat sink of the application To compare the heat dissipation performances of the heat sink of the application example and the heat sink of the comparative example on the basis of the obtained data, the thermal resistance $R_{th,tot}$ of each heat sink, the mean absolute temperature deviation (MATD) $\delta_{T,base}$ of the base plate of each heat sink, and the coolant pumping power $P_{tot}$ of each heat sink were calculated for each heat flux generated by the hot spot region of the heating according to Equations 1 to 4 above.

Test Result

Figure 5A:
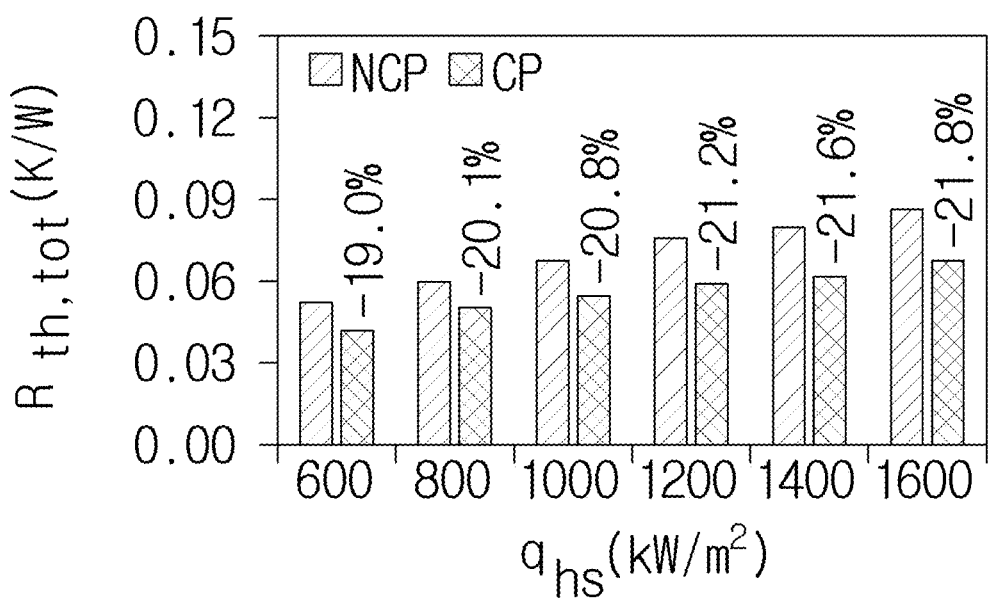
FIGS. 5A to 5C are graphs showing heat dissipation characteristics of the composite pin fin heat sink (CP) of the example according to this application and the non-composite pin fin heat sink (NCP) of the comparative example according to changes in a heat flux generated by a hot spot region of a heating element.
Figure 5B:
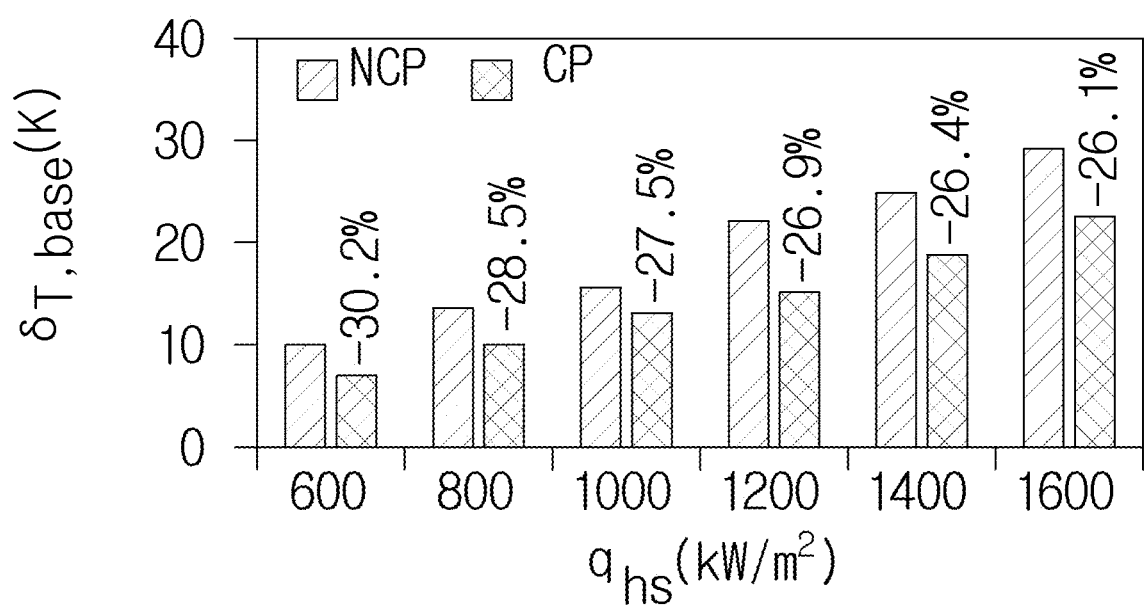
Figure 5C:
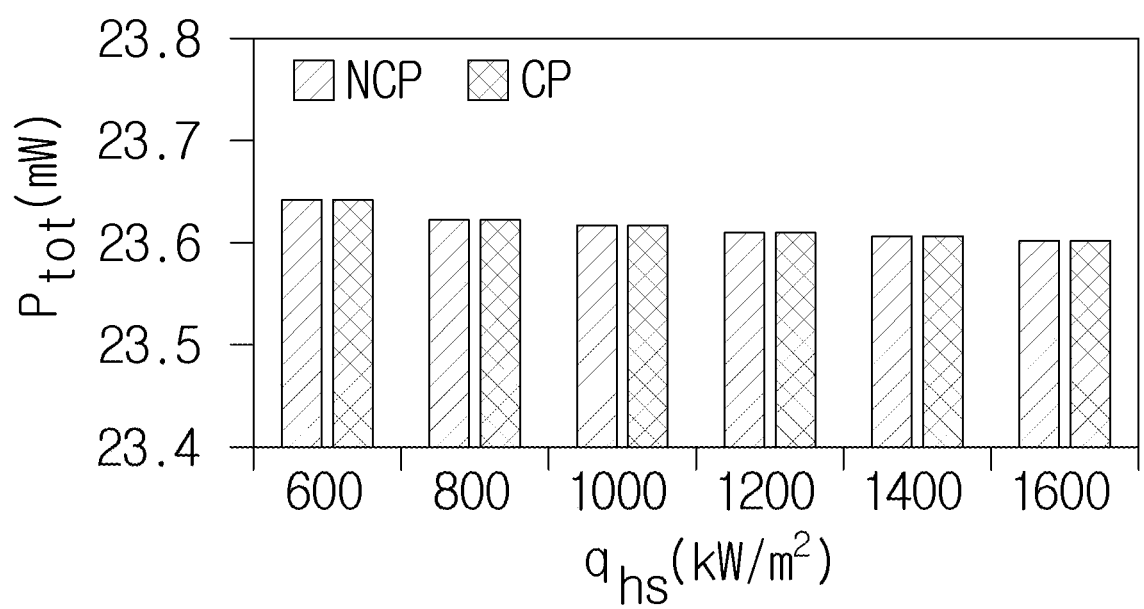
Figure 6A:
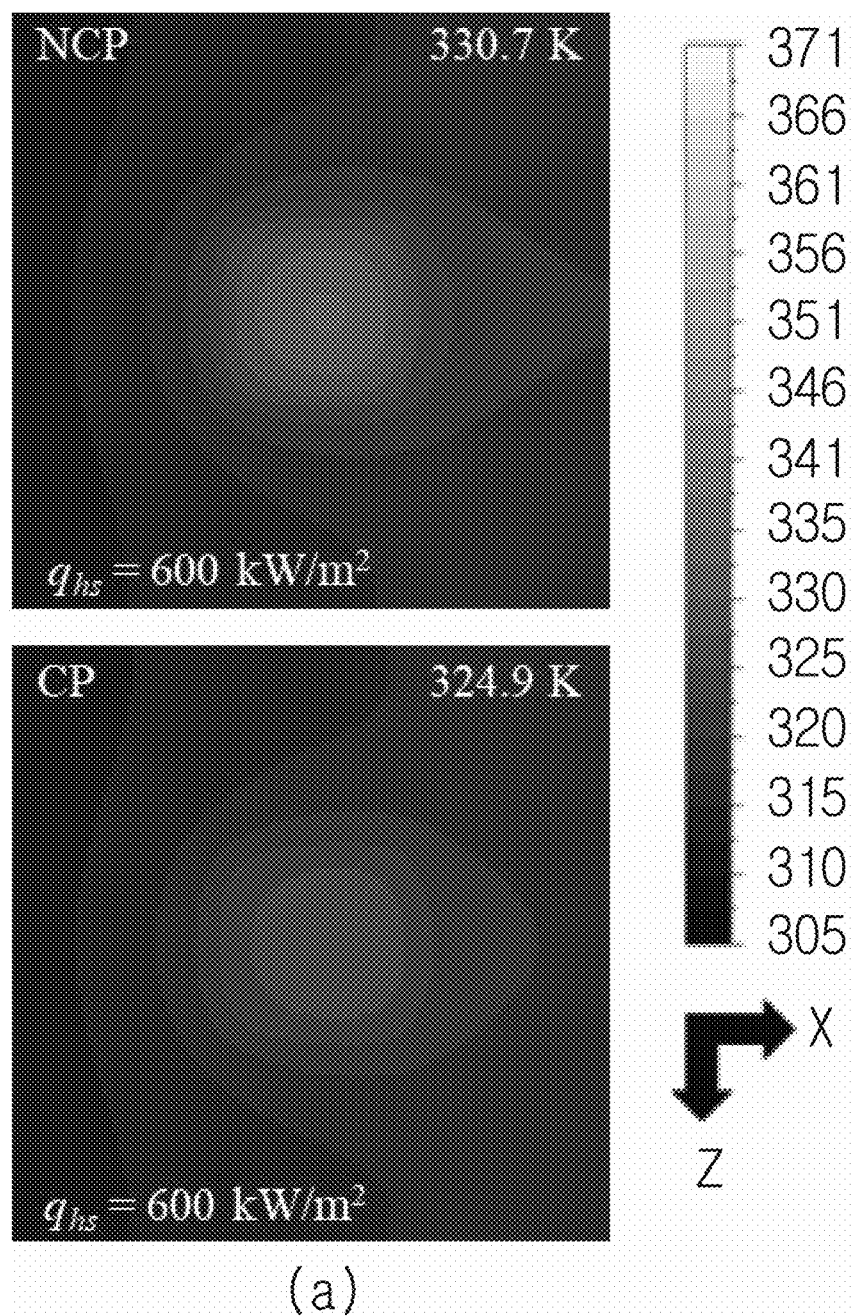
FIGS. 6A to 6F are photographs showing cooling behaviors of the composite pin fin heat sink (CP) of the example according to this application and the non-composite pin fin heat sink (NCP) of the comparative example according to the changes in the heat flux generated by the hot spot region of the heating element.
Figure 6B:
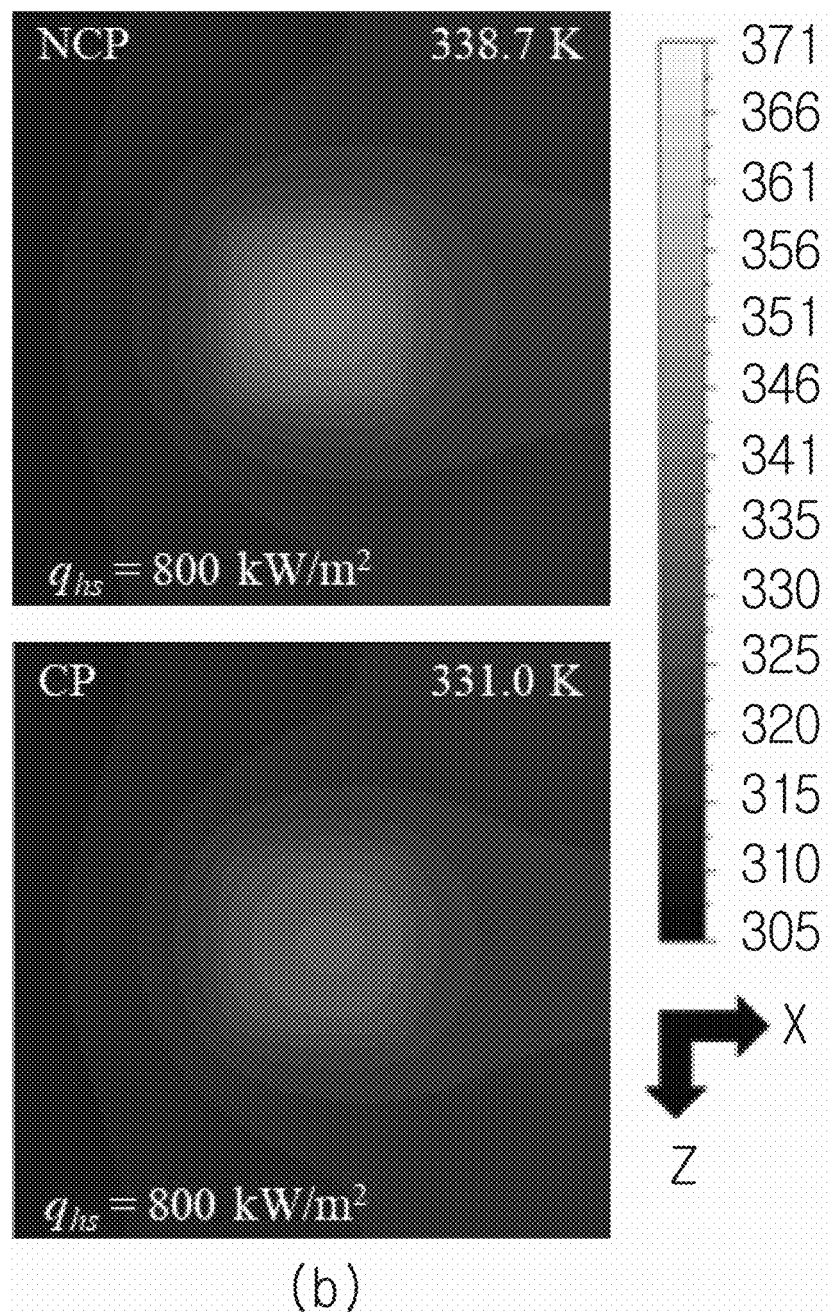
Figure 6C:
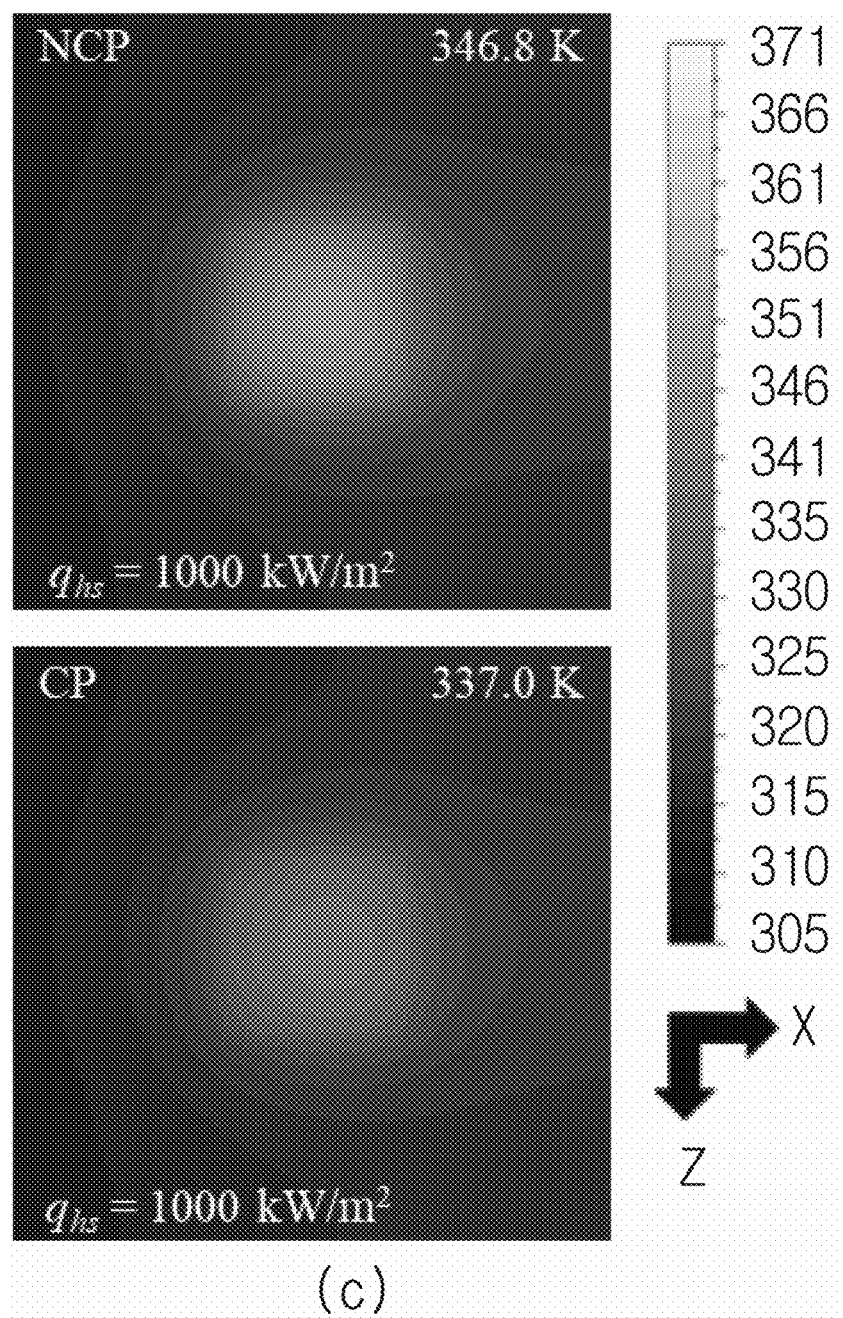
Figure 6D:
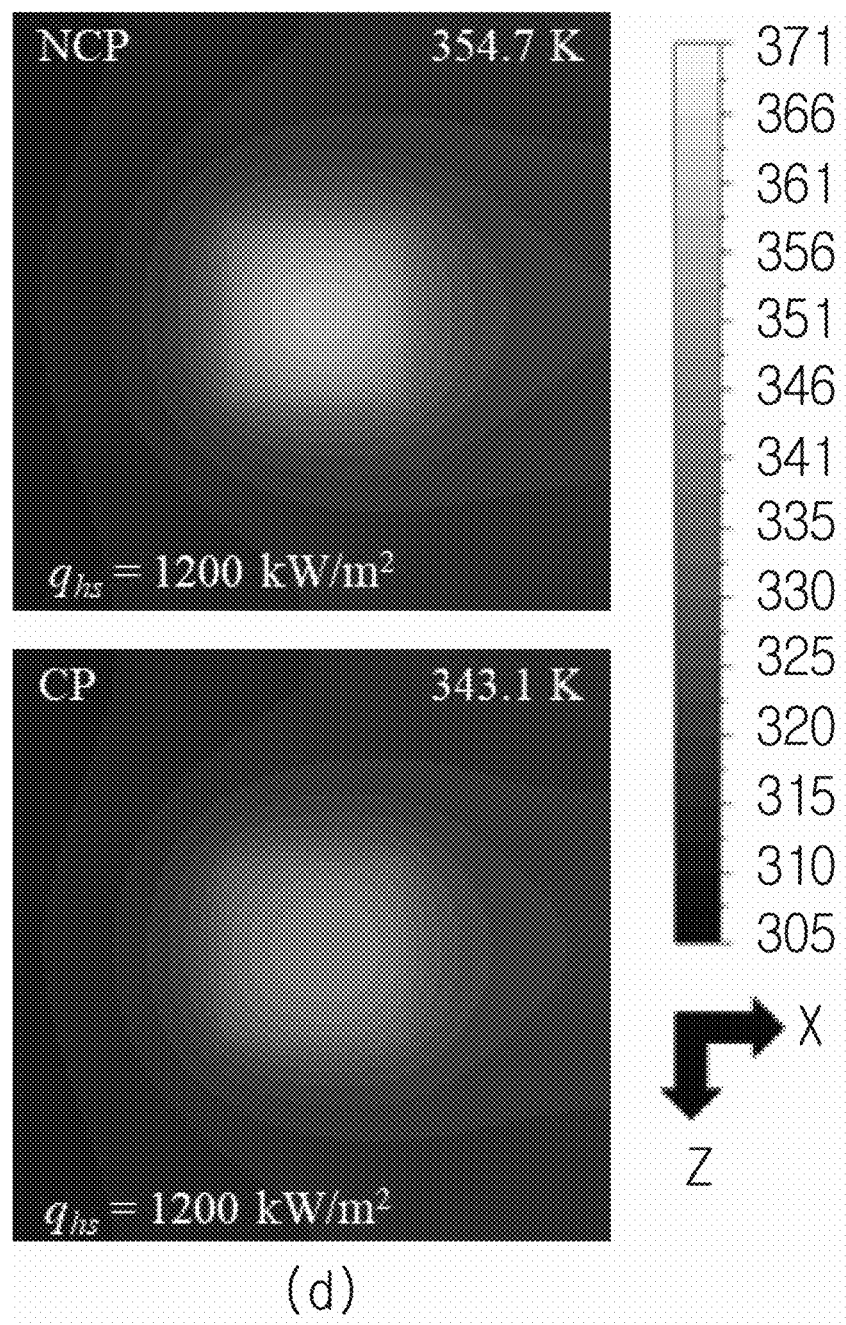
Figure 6E:
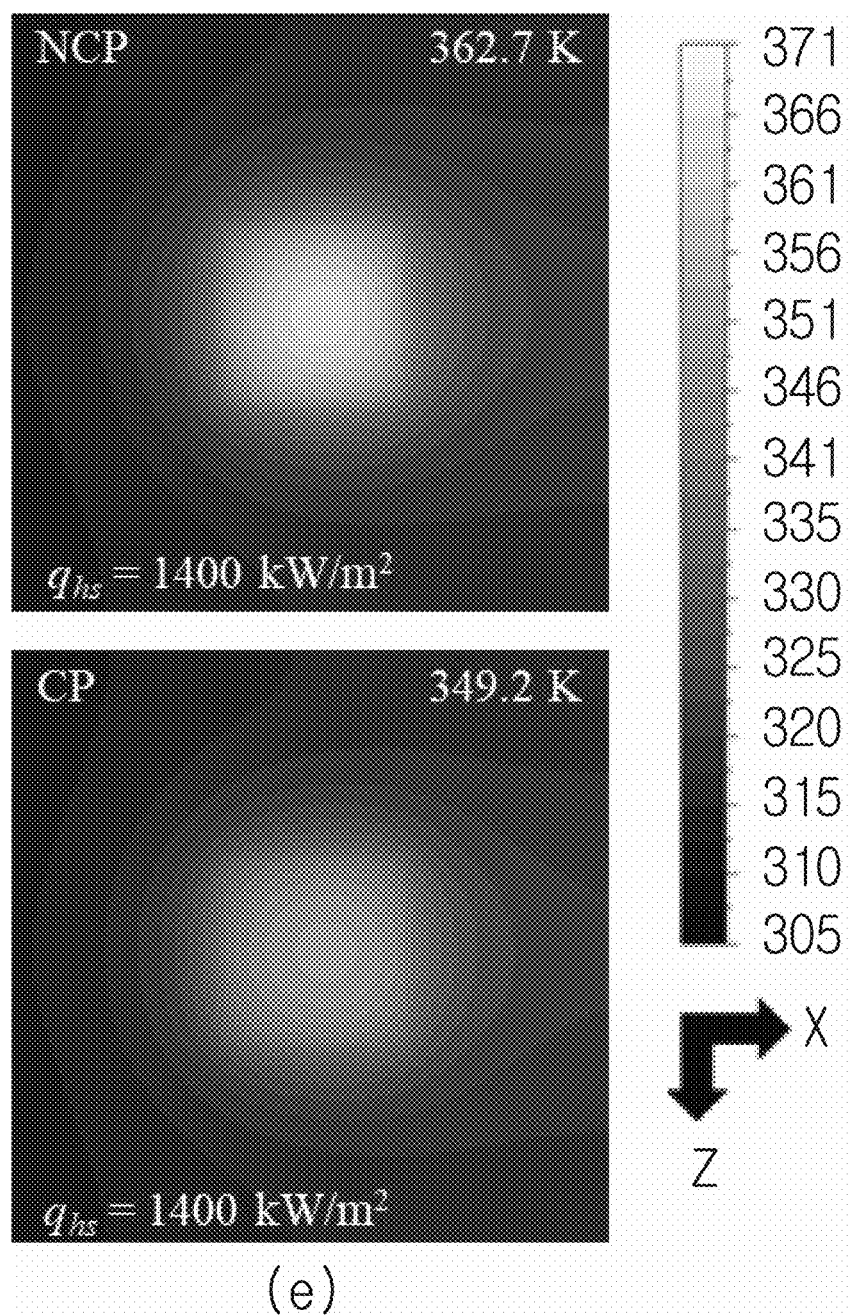
Figure 6F:
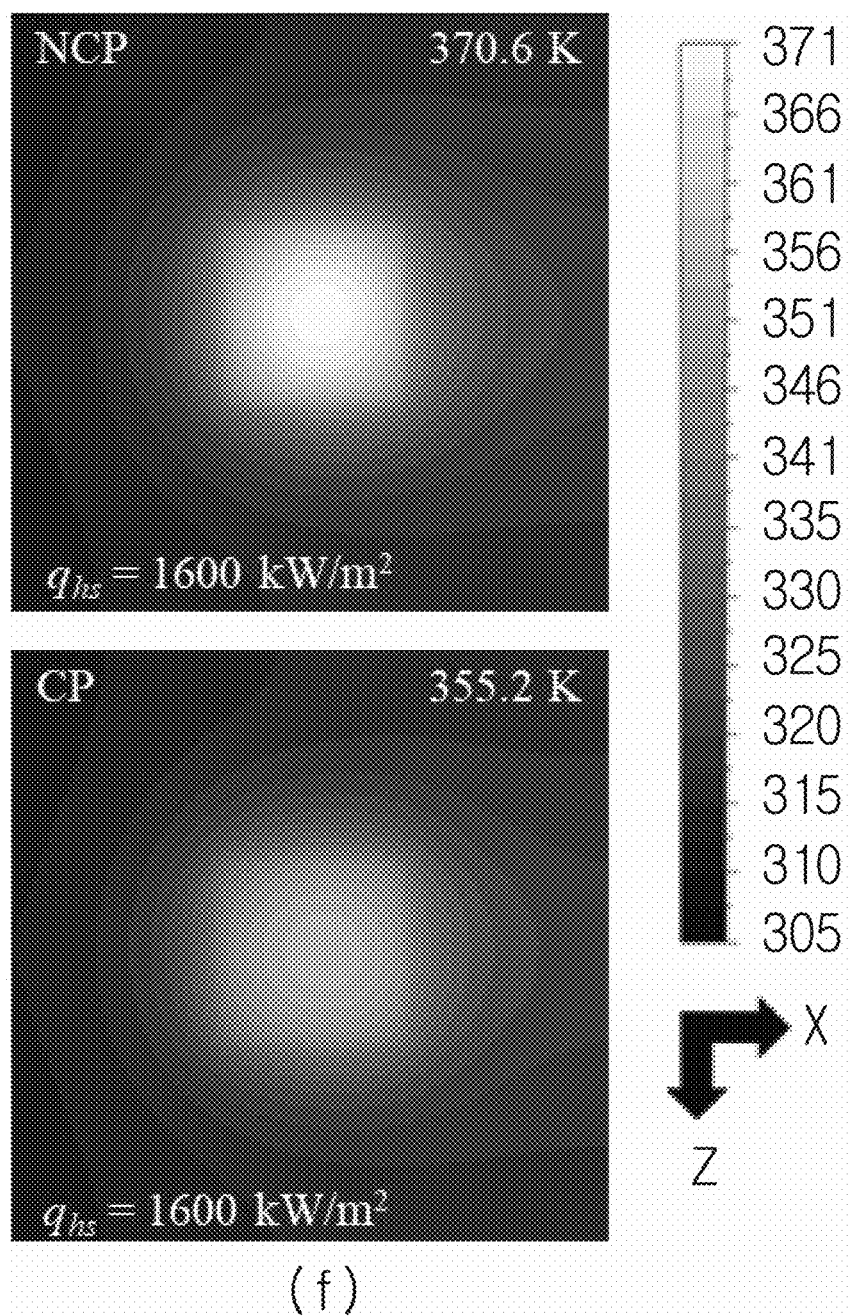

FIGS. 5A to 5C and Table 3 below show the thermal resistance $R_{th,tot}$, the MATD $\delta_{T,base}$, and the coolant pumping power $P_{tot}$ of the heat sink of the application example (denoted by CP) and the heat sink of the comparative example (denoted by NCP) that vary according to changes in the heat flux generated by the hot spot region of the heating element. The percentage values above the bars for CP in FIGS. 5A and 5B represent how much the numerical value of the CP is reduced compared to the numerical value of the NCP. In addition, the X axis in the graphs represents the heat flux generated by the hot spot region.

TABLE 3

|  |  | Heat Flux of Hotspot Region of Heating Element ($q_{hs}$, kW/m², Reynolds Number 865) | | | | | |
| --- | --- | --- | --- | --- | --- | --- | --- |
|  |  | 600 | 800 | 1000 | 1200 | 1400 | 1600 |
| Thermal Resistance ($R_{th,tot}$, K/W) | Comparative Example (NCP) | 0.052 | 0.061 | 0.069 | 0.076 | 0.081 | 0.087 |
|  | Application Example (CP) | 0.042 | 0.049 | 0.055 | 0.060 | 0.064 | 0.068 |
| MATD ($\delta_{T,base}$, 1 K) | Comparative Example (NCP) | 9.6 | 13.6 | 17.6 | 21.6 | 25.6 | 29.5 |
|  | Application Example (CP) | 6.7 | 9.8 | 12.3 | 15.8 | 18.8 | 21.8 |
| Pumping Power ($P_{tot}$, mW) | Comparative Example (NCP) | 23.64 | 23.63 | 23.62 | 23.62 | 23.61 | 23.60 |
|  | Application Example (CP) | 23.65 | 23.64 | 23.63 | 23.62 | 23.61 | 23.60 |

Referring to Table 3 and FIG. 5A, when the hot spot heat flux was varied in the order of 600 kW/m², 800 kW/m², 1000 kW/m², 1200 kW/m², 1400 kW/m², and 1600 kW/m², the thermal resistance $R_{th,tot}$ of the CP was reduced by 19.0%, 20.1%, 20.8%, 21.2%, 21.6%, and 21.8%, respectively, compared to the thermal resistance $R_{th,tot}$ of the NCP. This means that the thermal performance of the heat sink of the application example is higher than the thermal performance of the heat sink of the comparative example at any heat flux, and the heat dissipation performance of the heat sink of the application example is better than the heat dissipation performance of the heat sink of the comparative example.

In addition, referring to Table 3 and FIG. 5B, when the hot spot heat flux was varied in the order of 600 kW/m², 800 kW/m², 1000 kW/m², 1200 kW/m², 1400 kW/m², and 1600 kW/m², the MATD $\delta_{T,base}$ of the CP was reduced by 30.2%, 28.5%, 27.5%, 26.9%, 26.4%, and 26.1%, respectively, compared to the MATD $\delta_{T,base}$ of the NCP. This means that the heat sink of the application example more uniformly dissipates the heat of the heating element compared to the heat sink of the comparative example at all of the hot spot heat fluxes, thereby more effectively reducing the temperature gradient of the heating element.

Referring to Table 3 and FIG. 5C, there is almost no difference in the coolant pumping power $P_{to}$ between the heat sink of the application example and the heat sink of the comparative example. This means that the heat sink of the application example and the heat sink of the comparative example are geometrically identical to each other.

FIGS. 6A to 6F are temperature contours showing the cooling behavior of the heating element according to changes in the heat flux generated by the hot spot region of the heating where CP denotes the composite pin fin heat sink 10 of the application example and NCP denotes the non-composite pin fin heat sink of the comparative example, the temperature in the upper right corner is the maximum temperature of the hot spot region of the heating element, and $q_{hs}$ denotes the heat flux generated by the hot spot region of the heating element.

Referring to FIGS. 6A to 6F, it can be observed that the maximum temperature of the hot spot region of the heating element to which the heat sink of the application example was applied is lower than the maximum temperature of the hot spot region of the heating element to which the heat sink of the comparative example was applied for every value of the heat flux. This means that the heat sink of the application example can more effectively cool the hot spot region of the heating element than the heat sink of the comparative example, and thus the heat sink of the application example can more effectively reduce the temperature gradient of the heating element than the heat sink of the comparative example.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A composite pin fin heat sink configured to dissipate heat generated by a heating element, the heating element comprising a background region and a hot spot region having a higher temperature than the background region while the heating element is generating heat, the heat sink comprising:
   a base plate comprising a first surface and a second surface, the first surface of the base plate being configured to contact the heating element; and
   an array of pin fins protruding from the second surface of the base plate and arranged at regular intervals on the second surface of the base plate,
   wherein the base plate and the array of pin fins are divided into a first heat sink region corresponding to the hot spot region of the heating element, and a second heat sink region corresponding to the background region of the heating element, and
   wherein the first heat sink region is made of a material having a higher thermal conductivity than a material of which the second heat sink region is made,
   wherein under conditions that a heat flux of 200 kW/m² generated by the background region of the heating element and a heat flux of 600 kW/m² generated by the hot spot region of the heating element are dissipated by water having a Reynolds number of 108 to 865 supplied to the heat sink as a coolant, a mean absolute temperature deviation $\delta_{T,base}$ of the first surface of the base plate calculated according to the following equation has a value of 6.7 K to 14.0 K:

$$\delta_{T,base} = \frac{|T_{max,base} - T_{avg,base}| + |T_{min,base} - T_{avg,base}|}{2}$$

where $T_{max,base}$ and $T_{min,base}$ are a maximum temperature and a minimum temperature, respectively, of the first surface of the base plate while the heating element is generating heat, and $T_{avg,base}$ is an average temperature of the first surface of the base plate while the heating element is generating heat.

2. The heat sink of claim 1, wherein a thermal conductivity of the material of the first heat sink region is 30% to 80% higher than a thermal conductivity of the material of the second heat sink region.

3. The heat sink of claim 1, wherein the first heat sink region is made of copper, and the second heat sink region is made of aluminum.

4. The heat sink of claim 1, wherein under conditions in which a heat flux of 200 kW/m² generated by the background region of the heating element and a heat flux of 600 kW/m² generated by the hot spot region of the heating element are dissipated by water having a Reynolds number of 108 to 865 supplied to the heat sink as a coolant, a thermal resistance $R_{th,tot}$ of the heat sink calculated according to the following equation has a value of 0.042 K/W to 0.085 K/W:

$$R_{th,tot} = \frac{T_{max,base} - T_{f,in}}{Q_{tot}}$$

where $T_{max,base}$ is a maximum temperature of the first surface of the base plate while the heating element is generating heat, $T_{f,in}$ is an initial temperature of the coolant supplied to the heat sink, and $Q_{tot}$ is a total amount of heat transferred from the heating element to the heat sink.

5. The heat sink of claim 1, wherein under conditions that a heat flux of 200 kW/m² generated by the background region of the heating element and a heat flux of 600 kW/m² to 1600 kW/m² generated by the hot spot region of the heating element are dissipated by water having a Reynolds number of 865 supplied to the heat sink as a coolant, a thermal resistance $R_{th,tot}$ of the heat sink calculated according to the following equation has a value of 0.042 K/W to 0.085 K/W:

$$R_{th,tot} = \frac{T_{max,base} - T_{f,in}}{Q_{tot}}$$

where $T_{max,base}$ is a maximum temperature of the first surface of the base plate while the heating element is generating heat, $T_{f,in}$ is a temperature of the coolant supplied to the heat sink, and $Q_{tot}$ is a total amount of heat transferred from the heating element to the heat sink.

6. The heat sink of claim 1, wherein under conditions that a heat flux of 200 kW/m² and a heat flux of 600 kW/m² to 1600 kW/m² generated by the hot spot region of the heating element are dissipated by water having a Reynolds number of 865 supplied to the heat sink as a coolant, a mean absolute temperature deviation $\delta_{T,base}$ of the first surface of the base plate calculated according to the following equation has a value of 6.7 K to 21.8 K:

$$\delta_{T,base} = \frac{|T_{max,base} - T_{avg,base}| + |T_{min,base} - T_{avg,base}|}{2}$$

where $T_{max,base}$ and $T_{min,base}$ are a maximum temperature and a minimum temperature, respectively, of the first surface of the base plate while the heating element is generating heat, and $T_{avg,base}$ is an average temperature of the first surface of the base plate while the heating element is generating heat.

7. The heat sink of claim 1, wherein each of the pin fins has a cylindrical shape having an aspect ratio of 5.5 to 7, where the aspect ratio is a ratio of a height of each of the pin fins to a diameter of each of the pin fins, and
   wherein a ratio of the diameter of each of the pin fins to a distance between each of the pin fins is 0.45 to 0.55.

8. The heat sink of claim 1, wherein a ratio of a height of each of the pin fins to a thickness of the base plate is 3.5 to 4.5.

* * * * *